United States Patent [19]
Magome et al.

[11] Patent Number: 4,710,026
[45] Date of Patent: Dec. 1, 1987

[54] POSITION DETECTION APPARATUS
[75] Inventors: Nobutaka Magome, Kawasaki; Yutaka Ichihara, Yokohama, both of Japan
[73] Assignee: Nippon Kogaku K. K., Tokyo, Japan
[21] Appl. No.: 840,880
[22] Filed: Mar. 18, 1986
[30] Foreign Application Priority Data
  Mar. 22, 1985 [JP] Japan ................... 60-57890
  Sep. 5, 1985 [JP] Japan ................. 60-196783
[51] Int. Cl.$^4$ .............................. G01B 9/02
[52] U.S. Cl. .................... 356/349; 356/356; 356/363; 356/400
[58] Field of Search ............... 356/349, 356, 359, 363, 356/400

[56] References Cited
U.S. PATENT DOCUMENTS
  4,636,077 1/1987 Nomura et al. .................... 356/356

FOREIGN PATENT DOCUMENTS
  0207805 12/1982 Japan ................................... 356/356

Primary Examiner—Vincent P. McGraw
Assistant Examiner—S. A. Turner
Attorney, Agent, or Firm—Shapiro and Shapiro

[57] ABSTRACT

An apparatus includes a means for providing a predetermined frequency difference between two light beams and generating an optical beat with respect to interference between first and second diffracted light beams from a diffraction grating formed on a substrate, and a means for detecting a phase difference between the optical beat and a reference signal having a frequency corresponding to the frequency difference between the two light beams, and detects a position of the substrate based upon the phase difference in accordance with an optical heterodyne interference method.

17 Claims, 9 Drawing Figures 241  242  243  244

254 253 252 251

4,710,026

POSITION DETECTION APPARATUS

BACKGROUND OF THE INVENTION

1. Field of the Invention

The present invention relates to a position detection apparatus for a semiconductor wafer, a photomask, and the like using a diffraction grating and, more particularly, to a position detection apparatus suitable for alignment in accordance with a holographic alignment method.

2. Related Background Art

Recent semiconductor devices have been highly micropatterned and integrated, and alignment of a photomask (reticle) with a wafer necessary for manufacturing a semiconductor device requires a higher precision. In order to accomplish this, a holographic alignment method disclosed in, e.g., Japanese Patent Disclosure No. 192917/1983 has been proposed. In this method, two coherent light beams having the same frequency are incident from two directions. A wafer, which has a diffraction grating aligned parallel to interference fringes obtained by interference between the two light beams, is arranged along a common optical path of the two light beams. Then, light beams reflected, transmitted, or diffracted by the diffraction grating are again interfared with each other, and a position of the interference fringes relative to the position of the diffraction grating is detected based on a signal obtained by photoelectrically converting the interference intensity. In other words, this method detects a change in interference intensity due to changes in phases of first diffracted light generated in a specific direction upon radiation of one of the two light beams onto the diffraction grating and second diffracted light generated in another specific direction upon radiation of the other light beam onto the diffraction grating according to movement of the diffraction grating relative to the two light beams. This method can improve a detection precision, but creates a serious problem in practical applications. More specifically, changes in intensities of first and second diffracted light beams due to a change in intensity of a light source for generating two coherent light beams, a change in intensity ratio between two light beams, and mismatching of a diffraction grating directly cause position detection errors. Although the change in intensity of the light source and the change in intensity ratio between two light beams can be considerably eliminated during apparatus design and the manufacture thereof, time variations cannot be eliminated. Since the changes in intensities of the first and second diffracted light beams occur depending on a shape of the diffraction grating and its surface condition, it is difficult to compensate for them at the apparatus side.

Furthermore, a photo-electrical signal, whose level varies in accordance with deviations, cannot be obtained unless the interference fringes formed by the two light beams are moved relative to the diffraction grating on the wafer. This means that precise alignment is disabled until the interference fringes and the diffraction grating are relatively moved by one period. This also means that alignment time cannot be shortened in the apparatus.

SUMMARY OF THE INVENTION

It is a principal object of the present invention to provide an apparatus which is free from the conventional drawbacks, and can perform position detection with high precision irrespective of a change in light intensity.

It is another object of the present invention to provide a position detection apparatus which can detect an amount of deviation within one period without moving two light beams relative to a diffraction grating.

An apparatus of the present invention includes a means for providing a predetermined frequency difference between two light beams and generating an optical beat with respect to interference between first and second diffracted light beams from a diffraction grating formed on a substrate, and a means for detecting a phase difference between the optical beat and a reference signal having a frequency corresponding to the frequency difference between the two light beams, and detects a position of the substrate based on the phase difference in accordance with an optical heterodyne interference method.

When the present invention is applied to an apparatus for measuring matching precision of a pattern formed on a semiconductor substrate in a semiconductor manufacturing apparatus, an apparatus with considerably high precision can be realized.

DETAILED DESCRIPTION OF THE PREFERRED EMBODIMENTS

Figure 1:
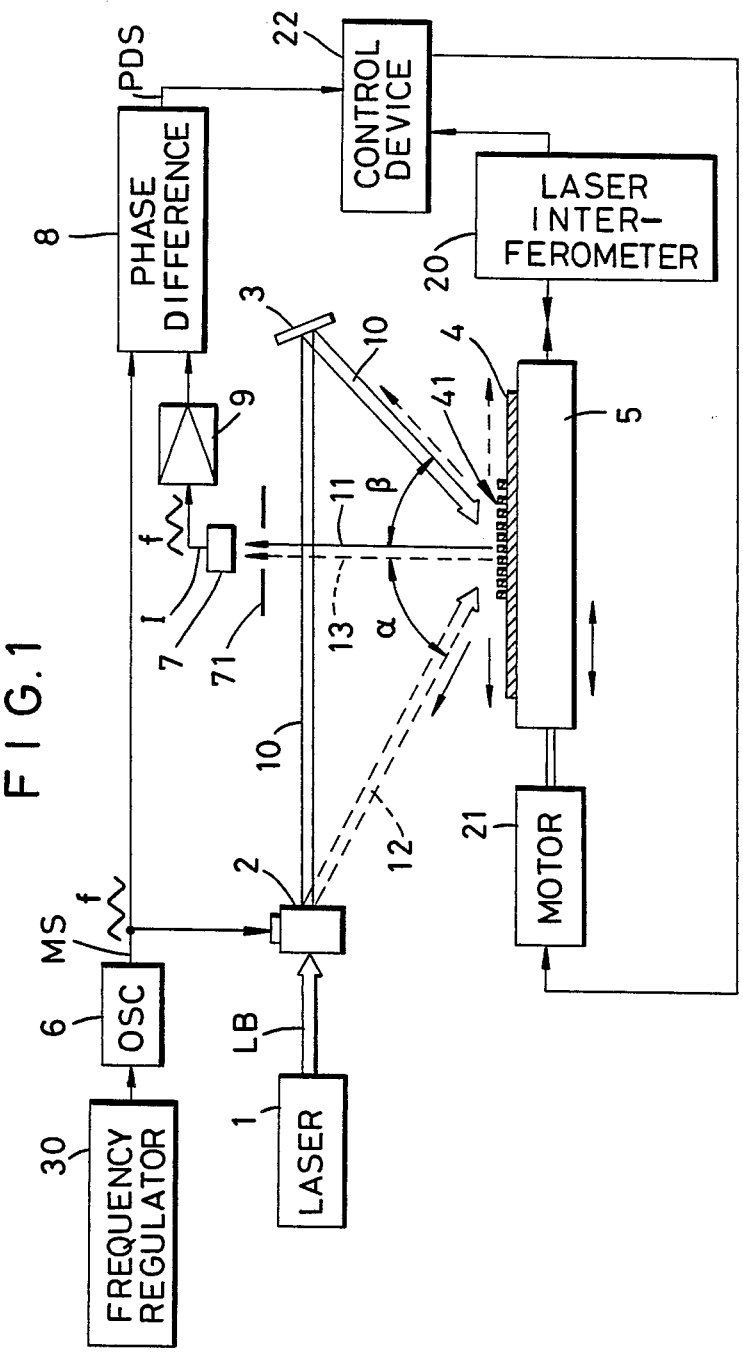
FIG. 1 is a schematic block diagram of a position detection apparatus according to a first embodiment of the present invention.

FIG. 1 shows schematic arrangement of a position detection apparatus according to a first embodiment of the present invention. Laser beams LB from a laser beam source 1 are incident on an acoustooptic modulator 2 to form two light beams 10 and 12. The collimated 0th-order light beam 10 of the laser beams LB is reflected by a mirror 3, and is obliquely radiated onto a substrate (e.g., a wafer) 4. The light beam (+1st-order light beam) 12 frequency-modulated by the modulator 2 is deflected by a predetermined angle with respect to the 0th-order light beam 10, and is obliquely radiated onto the substrate 4 as a collimated light beam. The modulator 2 receives a reference signal (modulation signal) MS having a frequency f from an oscillator 6 so as to shift a frequency of the modulated light beam 12 by f from that of the 0th-order light beam 10.

The substrate 4 comprises a diffraction grating 41, in which elongated grating elements extending in a direction perpendicular to the drawing are arranged in a left-and-right direction of the drawing to be parallel to each other at a given pitch. The two light beams 10 and 12 are incident so that interference fringes obtained by interference between the 0th-order light beam 10 and the modulated light beam 12 are parallel to the grating elements in the diffraction grating 41. At this time, since frequencies of the 0th-order light beam 10 and the modulated light beam 12 are different from each other, the interference fringes due to the two light beams are not fixed in position but move at the frequency f with respect to the substrate 4, thus generating an optical beat. A pitch of the interference fringes has an integral multiple of that of the diffraction grating 41.

The substrate 4 is placed on a stage 5 for alignment, which is movable in the left-and-right direction of the drawing by a driving motor 21. Positions of the stage 5 with respect to the apparatus main body are subsequently detected by a laser interferometer 20.

When the 0th-order light beam 10 is radiated onto the diffraction grating 41, diffracted light beams of various orders of diffraction are generated at corresponding angles. A diffracted light beam 11 of a certain order generated at a diffraction angle $\beta$ is received by a photo-electric detector (e.g., photomultiplier) 7 through a slit plate 71 having slit parallel to the grating 41. At the same time, since the modulated light 12 becomes incident on the diffraction grating 41, this also produces diffracted light beams of various orders of diffraction at corresponding diffraction angles. The photo-electric detector 7 receives through the slit plate 71 a diffracted light beam 13 of a certain order, which is generated at a diffraction angle $\alpha$ and propagates along substantially the same optical path as the light beam 11. Fringes are formed on the light-receiving surface of the photo-electric detector 7 due to the interference between the diffracted light beams 11 and 13, and the fringes are changed at a frequency of the optical beat, that is, at the frequency f of the reference signal MS. Thus, the photo-electrical signal I from the photo-electric detector 7 has a sinusoidal waveform of the frequency f. The photo-electrical signal is amplified by an amplifier 9, and then supplied to a phase-difference detector 8. The detector 8 also receives the reference signal MS from the oscillator 6 to detect a phase error of the photo-electrical signal with respect to the reference signal MS, and produces a phase-difference signal PDS corresponding to an amount of deviation.

A main control device 22 receives the phase-difference signal PDS and position data from an interferometer 20, and servo-controls the motor 21 so that the phase-difference signal PDS becomes zero (e.g., the phase error is zero). Thereby, one-dimensional alignment of the substrate 4 is made. Note that the phase-difference detector 8 can use an FM detection circuit or phasemeter. A frequency regulator 30 for varying the oscillation frequency f is connected to the oscillator 6 to adjust the angle $\alpha$ by varying a deflection angle of the modulated light beam 12 with respect to the 0th-order light beam 10 emitted from the modulator 2. In general, after a pitch of the diffraction grating, a wavelength of coherent light, and an incident angle of the coherent light are determined, directions of the diffracted light beams of respective orders are uniquely determined. For this reason, the diffracted light beam 13 of a certain order of diffraction cannot always be generated along the optical path parallel to another diffracted light beam 11, and cannot always accurately pass through the slit plate 71. In order to overcome this, optical adjustment is performed so that the incident angle of the modulated light beam 12 is fine-adjusted and the diffracted light beam 13 of the certain order is just parallel to the diffracted light beam 11.

If the frequency f of the oscillator 6 is set to be variable, later adjustment can be freely performed. The laser beam source 1, the modulator 2, the mirror 3, and the slit plate 71 need not be accurately arranged during the manufacture thereof. Furthermore, since the respective optical members need not be moved mechanically, time variations are hard to occur.

The frequency f can be finely adjusted such that an amplitude (e.g., peak-to-peak) of the photo-electrical signal from the photo-electric detector 7 is detected and adjusted to be maximum. In this case, the regulator 30 can comprise a circuit for detecting the amplitude of the photo-electrical signal, a circuit for storing the maximum value of the detected amplitude, a circuit for sweeping an oscillation frequency within a predetermined range, and the like. For example, the maximum value of the amplitude is stored in the first frequency sweep operation, and the stored maximum value and the detected amplitude are compared with each other in the second frequency sweep operation. Then, when they coincide with each other, the sweep operations are stopped for fixing the frequency. In this way, the apparatus can be automatically set (self-set) under ideal conditions.

Note that FIG. 1 illustrates as if the modulated light beam 12 and the 0th-order light beam 10 are separated at a relatively large deflection angle. However, since such a large deflection angle cannot be obtained in practice, the optical path of the modulated light beam 12 is changed by a mirror to prepare an incident condition, as shown in FIG. 1. Since the 0th-order light beam 10 and the modulated light beam 12 have the frequency difference f, their wavelengths are also different from each other. However, a wavelength difference between absolute values of the wavelengths of the two light beams is very small (about $10^{-6}$ to $10^{-12}$), and they can be regarded to have same wavelength.

Figure 2:
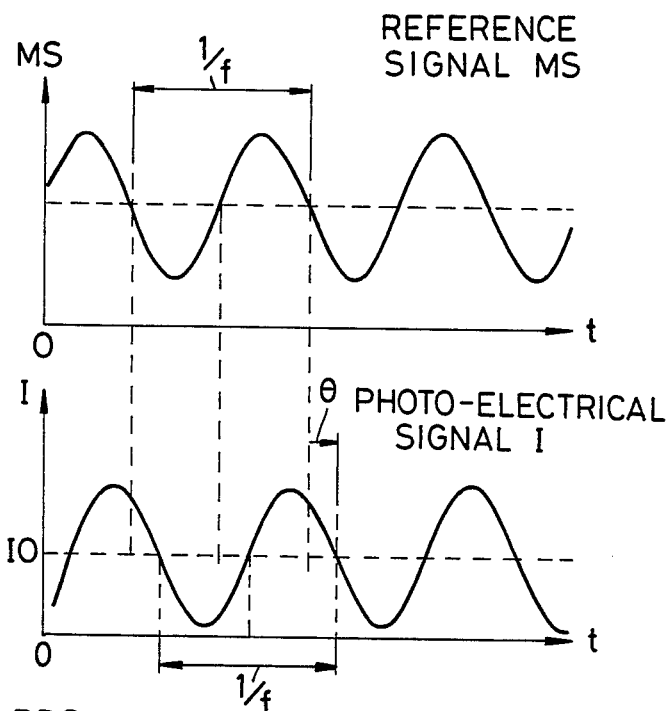
FIG. 2 is a timing chart of a reference signal MS and a photo-electrical signal I.
Figure 3:
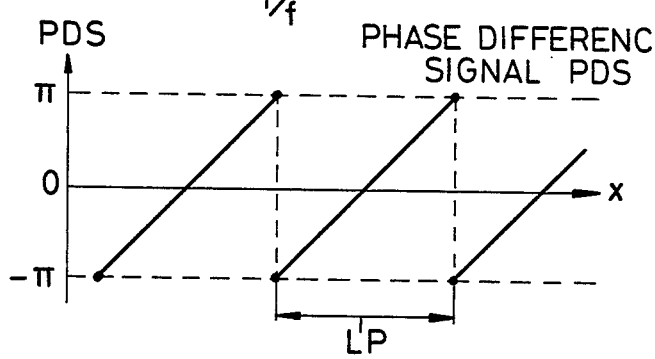
FIG. 3 is a graph showing output characteristics of a phase-difference signal.

The operation of this embodiment will now be described. FIG. 2 is a timing chart of the reference signal MS and the photo-electrical signal I from the photo-electric detector 7. In FIG. 2, the abscissa represents time t and the ordinate represents levels of the respective signals. As previously described, since the 0th-order light beam 10 and the modulated light beam 12 have the frequency difference f, the photoelectrical signal I becomes a so-called optical beat signal, and has a sinusoidal waveform at the frequency f similar to that of the reference signal MS. Assuming that the substrate 4 is fixed in position with respect to the two light beams 10 and 12, a phase difference $\theta$ between the reference signal MS and the photo-electrical signal I is constant. The phase difference $\theta$ can be easily obtained by the phase-difference detector 8 from the level of the phase-difference signal PDS. When the substrate 4 is moved by the stage 5, the phase difference $\theta$ continuously changes in proportion to the moving amount. Of course, a range to be detected as the phase difference $\theta$ is within $2\pi$, and if a direction of phase shift is taken into consideration, within $+\pi$. FIG. 3 is a graph showing output characteristics of the phase-difference signal PDS, in which the abscissa represents an output level of the signal PDS, and the ordinate represents a position x of the substrate 4 relative to the two light beams 10 and 12. When the substrate 4 is aligned with respect to the two light beams 10 and 12, coarse alignment is first performed by means of the stage 5, so that an alignment error falls within a range LP (corresponding to $+\pi$ of the phase difference) by a known pre-alignment or global-alignment means. If the two light beams 10 and 12 have a wavelength $\lambda$, the range LP is expressed by:

$$LP=\lambda/(\sin \alpha + \sin \beta)$$

For example, if the wavelength $\lambda$ is 600 nm (0.6 $\mu$m), and the angles $\alpha$ and $\beta$ are 30°, the range LP is 0.6 $\mu$m from the above equation. If a precise position of the alignment corresponds to a zero point of the phase-difference signal PDS, the coarse alignment requires precision of $\pm 0.3$ $\mu$m. Even if the wavelength is left unchanged, the range LP is widened and the precision of the coarse alignment is not so severe as the angles $\alpha$ and $\beta$ decrease. After completion of the coarse alignment, the main control device 22 fetches the phase-difference signal PDS, and detects a deviation direction based on the polarity thereof and an amount of deviation based on the magnitude thereof. Then, the device 22 causes the motor 21 to move the stage 5 finely to adjust the phase-difference signal PDS to be 0. Alternatively, since the phase-difference signal PDS changes linearly, the signal PDS can be fetched directly as an error signal in a feedback loop of a motor control circuit. In this case, referring to the previous example, a control system is automatically switched, such that the motor 21 is controlled based on the interferometer 20 until the precision of $\pm 0.3$ $\mu$m is obtained, and then based on the phase-difference signal PDS within the range of $\pm 0.3$ $\mu$m. In this way, the stage 5 is automatically moved until the phase-difference signal PDS is phase-locked at the zero point. This can effectively satisfy both high-precision and high-speed requirements.

In the above embodiment, one-dimensional alignment is performed. When two-dimensional alignment is to be performed, another diffraction grating extending along a direction perpendicular to the diffraction grating 41 is arranged on the substrate 4, and need only be irradiated with light beams of difference frequencies from two directions. The slit of the slit plate 71 is arranged parallel to the grating elements of the diffraction grating 41, but can be an opening (e.g., a pinhole). Furthermore, an optical system for enlarging and projecting a partial image of the diffraction grating 41 on the slit plate 71 can be provided between the slit plate 71 and the substrate 4.

Figure 4:
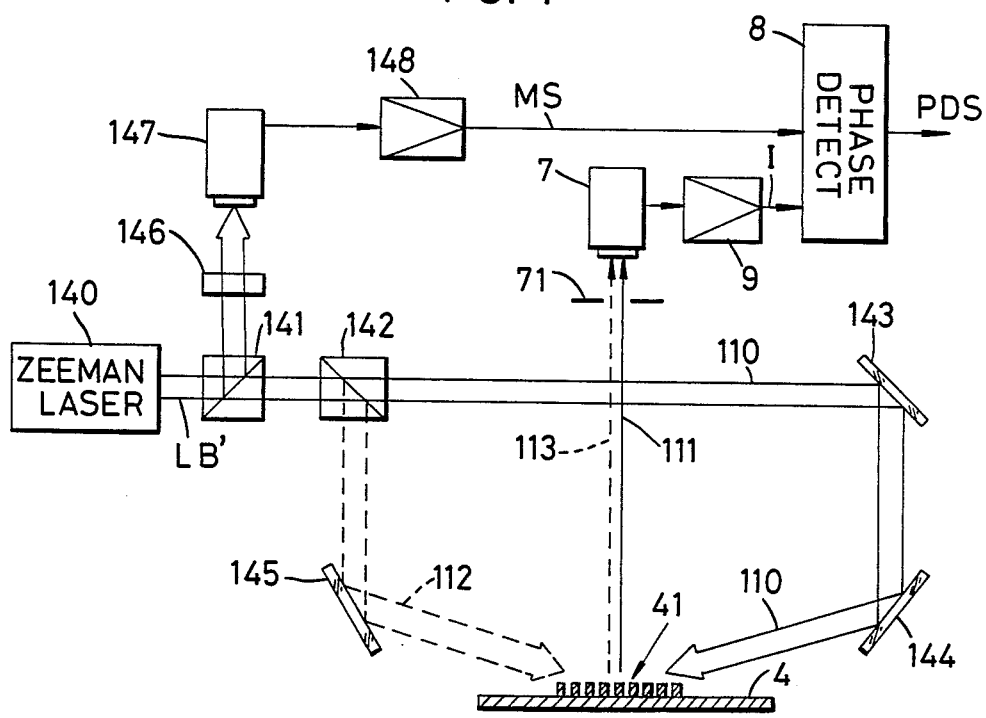
FIG. 4 is a schematic block diagram of a position detection apparatus according to a second embodiment of the present invention.

A second embodiment of the present invention will be described with reference to FIG. 4. In this embodiment, the same reference numerals denote the same parts as in FIG. 1. In this embodiment, a Zeeman Laser beam source 140 utilizing the Zeeman effect is used as a coherent light source. Zeeman laser beams LB' from the laser beam source 140 contain P- and S-polarized light components, which have a slight frequency difference therebetween.

The Zeeman laser beams LB' are split into two light beams by a half mirror 141, and one of these two beams is further split to P- and S-polarized beams 110 and 112 by a polarization beam splitter 142. The P-polarized beam 110 is reflected by mirrors 143 and 144, and is obliquely incident on a diffraction grating 41 of a substrate 4. The S-polarized beam 112 is reflected by a mirror 145 to be obliquely incident on the diffraction grating 41. Incident conditions of the P- and S-polarized beams 110 and 112 are the same as those in FIG. 1. Therefore, it is observed using analyzer that interference fringes are moved on the diffraction grating 41 at a frequency of an optical beat due to interference of the beams 110 and 112. In this embodiment, although not shown, an analyzer must be provided along each path of the beams 110 and 112 or between the diffraction grating 41 and a photo-electric detector 7, since polarization is utilized.

Meanwhile, the Zeeman laser beams LB' reflected by the half mirror 141 are transmitted through an analyzer 146 and are incident on a photomultiplier 147. An intensity thereof thus changes depending on a frequency corresponding to the difference between the frequencies of the P- and S-polarized beams. When a photo-electrical signal from the photomultiplier 147 is amplified by an amplifier 148, the same reference signal MS as in FIG. 1 is obtained. When a phase difference between the reference signal MS and the photo-electrical signal I is then detected by a phase-difference detector 8, a relative position of the substrate 4 can be detected. In this embodiment, a two-beam generating means is constituted by the Zeeman laser beam source 140, the polarization beam splitter 142, and the mirrors 143, 144, and 145, and a reference signal generating means is constituted by the half mirror 141, the analyzer 146, the photomultiplier 147, and the amplifier 148.

Figure 5:
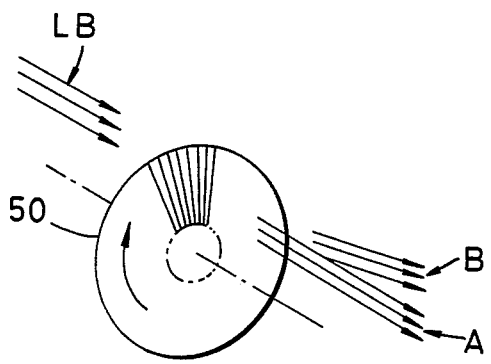
FIG. 5 is a perspective view of a main part of two-light beam emitting means according to a third embodiment of the present invention.

A third embodiment of the present invention will now be described with reference to FIG. 5. This embodiment shows a modification of the two-beam generating means, in which two coherent light beams A and B are obtained upon incidence of laser beams LB on a mechanically rotating radial grating plate 50. The beam A corresponds to the 0th-order beam 10, and the beam B corresponds to the modulated beam 12 in FIG. 1. A frequency difference between the two light beams A and B is proportional to a rotational speed of the radial grating plate 50 and, more specifically, a moving speed of the radial grating with respect to the laser beams LB. Therefore, a reference signal can be easily obtained from a speed sensor for detecting rotation of the radial grating plate 50. When the two light beams are to be obtained mechanically, since the frequency difference therebetween is at most several tens of kHz, a semiconductor light-receiving element of slower response than the photomultiplier can be used as a photo-electric sensor.

For another modification, two semiconductor lasers of the same type can be used as respective beam emitting means. In general, even if the semiconductor lasers of the same type are used, they have individual variations in characteristics, and laser beams emitted therefrom have a slight frequency difference therebetween. Therefore, these variations are positively used to obtain two beams. In this case, since the frequency difference is considered not to be constant, a polarizer is added for polarizing the light beams from the respective semiconductor lasers to vertical- and lateral-polarized beams. Thus, the separately polarized beams are mixed into a single light beam, and the mixed light beam is radiated on an analyzer shown in FIG. 3 to obtain the reference signal.

With this arrangement, a very compact position detection apparatus can be obtained. However, individual semiconductor lasers must have stable oscillation frequencies and must be free from mode jump, and so on.

An embodiment to which the present invention is applied to measurement of matching precision when a plurality of photosensitive layers are matched on a substrate, will now be described.

Figure 6:
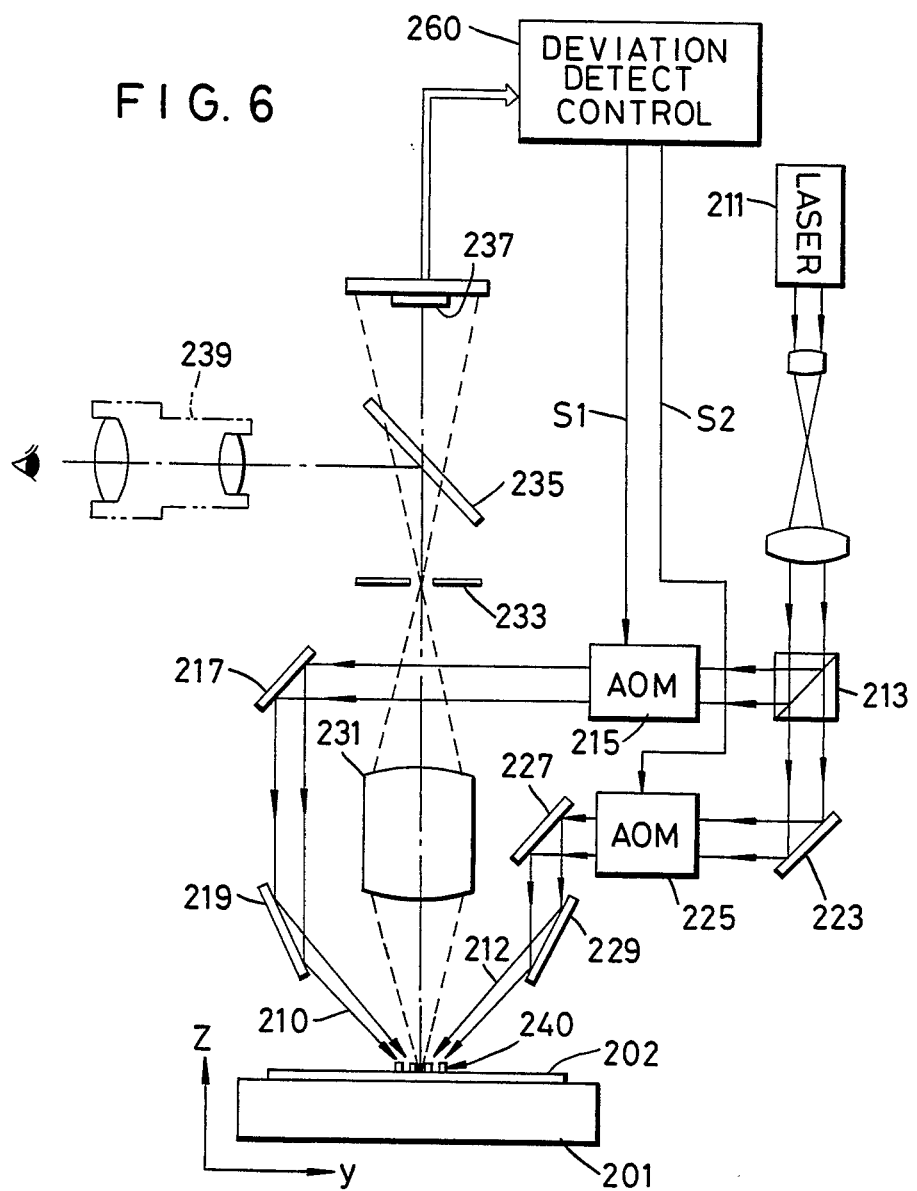
FIG. 6 is a schematic block diagram of a position detection apparatus according to the third embodiment of the present invention.

Referring to FIG. 6, a wafer 202 of interest is placed on a stage 201. The wafer 202 has already been subjected to the double printing and development process by an exposure apparatus, so that an exposure pattern formed on a photomask or reticle of the exposure apparatus is printed on the surface thereof.

Figure 7:
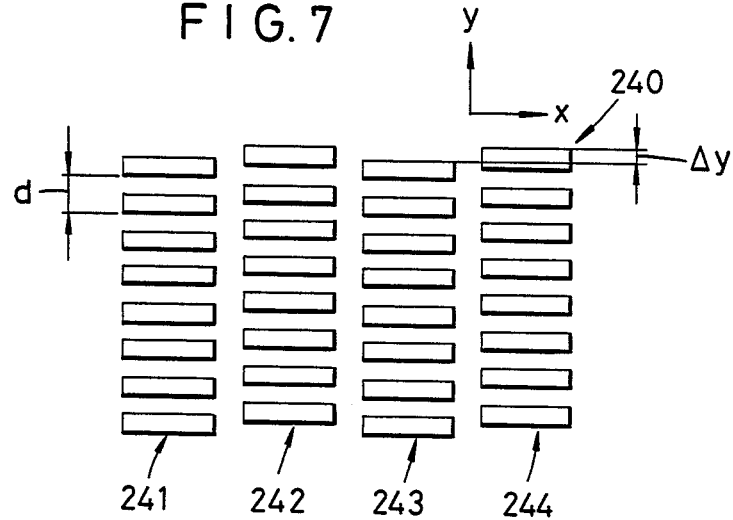
FIG. 7 is a plan view of a diffraction grating on a wafer.

When two exposure patterns are printed on the wafer 202, a grating pattern 240 representing printing positions of these patterns and having two pairs of diffraction gratings shown in FIG. 7 is formed thereon. A first pair of diffraction gratings 241 and 243 is printed on the wafer with the exposure pattern during a first exposure process, and consists of grating elements, which have a pitch d in the y direction and extend in the x direction. These gratings 241 and 242 are formed to be separate at a predetermined interval in the x direction.

In contrast to this, a second pair of diffraction gratings 242 and 244 are formed during a second exposure process, and consists of grating elements, which have a pitch d in the y direction and extend in the x direction. A pair of the grating elements is printed to be offset from the first pairs of the diffraction gratings in the y direction.

If the first and second pairs of the diffraction gratings are not offset in the y direction, the respective grating elements of the first and second pairs of the diffraction gratings 241, 243, 242, and 244 can be aligned in the x direction. In this case, it can be determined that there is no deviation between first and second exposure patterns. However, if the first and second exposure patterns are offset in the y direction by $\Delta y$, this offset appears as a deviation $\Delta y$ between the corresponding grating elements.

In order to form the first and second pairs of diffraction gratings 241, 243, 242 and 244 alternately, matching exposure can be performed using first and second photomasks or reticles on which diffraction grating patterns are formed to be offset in the x direction in advance. Alternatively, in order to accomplish this, diffraction grating patterns are formed at the same positions on first and second photomasks or reticles. When exposure is performed using one photomask, the photomask (or reticle) and the wafer can be offset in the x direction by a given distance during the printing process.

In doing so, two coherent light beams 210 and 212 having a frequency difference $\Delta f$ are radiated onto the first and second pairs of the diffraction gratings 241, 243, 242, and 244 from different directions, thereby producing interference fringes which scan the diffraction grating pattern 240 at the frequency $\Delta f$ in the direction of pitch of the grating elements. In this case, a pitch of interference fringes is determined to be ½ times the alignment pitch d of the grating elements constituting the diffraction grating.

In this embodiment, the coherent light beams 210 and 212 are formed based on a common laser 211. Laser beams generated from the laser 211 are split by a beam splitter 213 through a collimator lens system. A first laser beam is incident on an acoustooptic modulator 215, so that its frequency is shifted by a frequency $f_1$ of a modulation signal S1, and is then radiated as a first coherent beam 210 onto the diffraction grating pattern 240 on the wafer 202 by means of mirrors 217 and 219.

A second laser beam is incident on an acoustooptic modulator 225 through a mirror 223, so that its frequency is shifted by a frequency $f_2$ of a modulation signal S2, and is then radiated as a second coherent beam 212 onto the wafer 202 by means of mirrors 227 and 229.

+1st-order and -1st-order diffracted beams of the beams 210 and 212 by the grating pattern 240 on the wafer pass through an objective lens 231 while being interfered with each other, and are then radiated onto a photo-electric conversion element array 237 through an aperture 233 and a half mirror 235.

Figure 8:
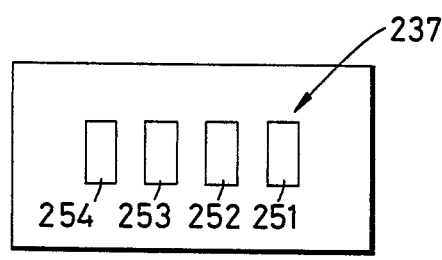
FIG. 8 is a plan view of a photo-electric conversion element array.

The photo-electric conversion element array 237 has photo-electric conversion elements 251, 252, 253, and 254 corresponding to the diffraction gratings 241, 242, 243, and 244, as shown in FIG. 8, which are aligned at positions corresponding to diffracted beam portions generated by the respective diffraction gratings.

Figure 9:
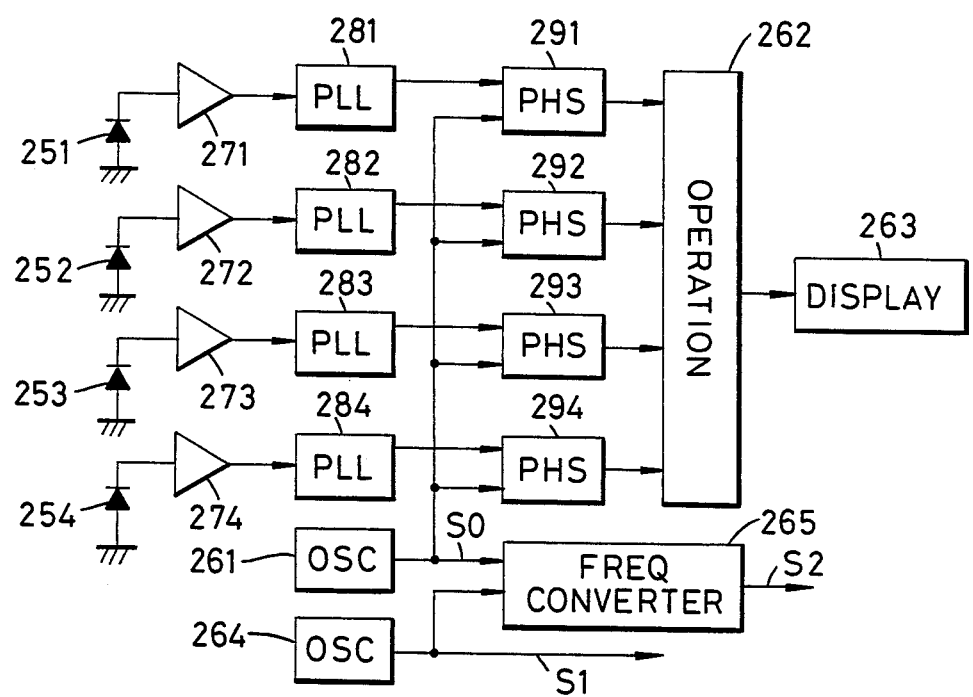
FIG. 9 is a block diagram of a deviation detection control circuit of FIG. 6.

The outputs from the elements 251, 252, 253, and 254 are supplied to a deviation detection control circuit 260 shown in FIG. 9. The circuit 260 supplies the outputs from these elements 251, 252, 253, and 254 to a PLL (phase locked loop) circuits 281, 282, 283, and 284 through preamplifiers 271, 272, 273, and 274, respectively. Thus, phase signals locked at phases of the outputs of the elements 251, 252, 253, and 254 can be obtained from the output terminals of the respective PLL circuits.

The diffracted beams radiated onto the elements 251, 252, 253, and 254 have phases corresponding to the positions of the diffraction gratings 241, 242, 243, and 244, respectively. Therefore, the phases of the respective phase signals indicate the y-direction positions of the corresponding diffraction gratings. For this reason, when a phase difference between the phases of the phase signals respectively corresponding to the first and second pairs of diffraction gratings 241, 243, 242, and 244 is detected, a deviation therebetween can be detected.

To accomplish this, the deviation detection control circuit 260 comprises: an oscillator 261 for supplying a reference signal S0 having a reference frequency $f_0$; phase comparators 291, 292, 293, and 294 for producing phase-difference outputs representing phase differences between the phases of the reference signal S0 and the respective phase signals; and operation unit 262 for calculating the positions of the diffraction gratings on the wafer based on the phase-difference outputs to operate a deviation between the first and second pairs of the diffraction gratings. The operation result is displayed on a display device 263.

The circuit 260 further comprises an oscillator 264 for generating a frequency output S1 having a frequency $f_1$, which is supplied to the modulator 215 (FIG. 6) as the modulation signal.

The frequency output S1 is supplied together with the reference signal S0 to the frequency converter 265, which then supplies a frequency output S2 having a sum frequency of the frequencies $f_1$ and $f_0$ to the modulator 215 as the modulation signal.

The half mirror 235 reflects the diffracted beams passing through the aperture 233 toward an eyepiece 239, so that the interference fringes can be visually observed. Thereby, incident directions of the coherent beams can be controlled so that the interference fringes coincide with extending directions of the grating elements as possible.

In the above embodiments, the first and second coherent beams are radiated onto the diffraction grating on the substrate from the different directions. However, if they have incident angles at which interference fringes can be generated on the diffraction grating, the two beams can be radiated along the same optical axis from the same direction. However, in this case, diffracted beams of the first and second beams must have different orders of diffraction.

What is claimed is:

1. An apparatus for detecting a position of an article on which a diffraction grating is provided, comprising:
   means for emitting first and second coherent light beams radiated onto said diffraction grating, said first and second light beams having different frequencies, thereby generating an optical beat based on interference between diffracted light beams of said first and second light beams which are generated from said diffraction grating;
   means for producing a reference signal having a frequency corresponding to a frequency difference between said first and second light beams; and
   means, including means for detecting said optical beat, for comparing a phase of said optical beat with that of said reference signal.

2. An apparatus according to claim 1, wherein said optical beat detection means includes aperture means for extracting the diffracted light beams of said first and second light beams which are generated in the same direction from said diffraction grating.

3. An apparatus according to claim 2, wherein said optical beat detection means includes photoelectric conversion means for receiving the diffracted light beams extracted by said aperture means.

4. An apparatus according to claim 1, wherein said emitting means includes means for determining incident directions of said first and second light beams, so that a direction of a specific diffracted light beam of said first light beam coincides with that of a specific diffracted light beam of said second light beam.

5. An apparatus according to claim 1, wherein said apparatus further includes means for determining a position of said article in response to said comparison means.

6. An apparatus according to claim 1, wherein said emitting means includes means for radiating coherent light beams, and optical modulation means for receiving the coherent light beams so as to radiate two light beams having a frequency difference corresponding to the frequency of said reference signal according thereto.

7. An apparatus according to claim 6, wherein said optical modulation means includes an acoustooptic modulator.

8. An apparatus according to claim 1, wherein said emitting means includes a Zeeman laser source for radiating coherent light beams including two different light components having different polarization directions and frequencies, and means for polarizing and splitting the coherent light beams from said Zeeman laser source.

9. An apparatus according to claim 8, wherein said reference signal producing means includes an analyzer arranged to partially pass the coherent light beams from said Zeeman laser source therethrough.

10. An apparatus according to claim 1, wherein said first and second light beams radiate said diffraction grating from different directions.

11. An apparatus for detecting a position of an article on which a diffraction grating is provided, comprising:
   an apparatus main body;
   means for two-dimensionally moving said diffraction grating with respect to said apparatus main body within a plane including said diffraction grating;
   means for measuring a position of said article with respect to said apparatus main body during the two-dimensional movement; and
   means for detecting the position of said article based on a pitch of said diffraction grating,
   said detection means including: means for emitting first and second coherent light beams radiated onto said diffraction grating, said first and second light beams having different frequencies, thereby generating an optical beat based on interference between diffracted light beams of said first and second light beams which are generated from said diffraction grating;
   means for producing a reference signal having a frequency corresponding to a frequency difference between said first and second light beams; and
   means, including means for detecting said optical beat, for comparing a phase of said optical beat with that of said reference signal.

12. An apparatus for detecting a deviation in one direction between first and second diffraction gratings which have a periodicity in said one direction and are arranged on an identical plane to be parallel to each other, comprising:
   means for emitting first and second coherent light beams radiated onto said first and second diffraction gratings, said first and second light beams having different frequencies, thereby generating interference fringes, which scan said first and second diffraction gratings at a frequency corresponding to a frequency difference between said first and second light beams;
   means for producing a first alternative output having a frequency corresponding to the frequency difference based on a diffracted light beam generated from said first diffraction grating by said interference fringes;
   means for producing a second alternative output having a frequency corresponding to the frequency difference based on a diffracted light beam generated from said second diffraction grating by said interference fringes; and
   means for comparing phases of said first and second alternative outputs.

13. An apparatus according to claim 12, wherein said first and second light beams radiate said first and second diffraction gratings from different directions.

14. An apparatus according to claim 12, wherein said apparatus further includes means for independently extracting the diffracted light beams generated respectively from said first and second diffraction gratings.

15. An apparatus according to claim 14, wherein said extracting means includes first and second photo-electric conversion means, and optical means for focusing the diffracted light beams generated from said first and second diffraction gratings onto said first and second photo-electric conversion means.

16. An apparatus according to claim 12, wherein said first and second diffraction gratings each includes grating elements arranged at a pitch d, and frequencies of said first and second light beams are set so that a pitch of said interference fringes is d/2.

17. An apparatus according to claim 12, wherein said comparison means determines a deviation between said first and second diffraction gratings based on a phase difference between said first and second alternative outputs.

* * * * *